United States Patent
Hirota et al.

(10) Patent No.: US 11,283,422 B2
(45) Date of Patent: Mar. 22, 2022

(54) RESONANCE DEVICE

(71) Applicant: Murata Manufacturing Co., Ltd., Nagaokakyo (JP)

(72) Inventors: Wakana Hirota, Nagaokakyo (JP); Toshio Nishimura, Nagaokakyo (JP); Ville Kaajakari, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 84 days.

(21) Appl. No.: 16/860,196

(22) Filed: Apr. 28, 2020

(65) Prior Publication Data
US 2020/0259476 A1  Aug. 13, 2020

Related U.S. Application Data

(63) Continuation of application No. PCT/JP2018/028311, filed on Jul. 27, 2018.
(Continued)

(51) Int. Cl.
*H03H 9/02* (2006.01)
*H03H 9/05* (2006.01)
(Continued)

(52) U.S. Cl.
CPC .... *H03H 9/02433* (2013.01); *H03H 9/02259* (2013.01); *H03H 9/0595* (2013.01);
(Continued)

(58) Field of Classification Search
CPC ........... H03H 9/02433; H03H 9/02259; H03H 9/0595; H03H 9/1057; H03H 9/2452; H03H 9/2484; H03H 9/2489; H03H 2009/02456

See application file for complete search history.

(56) References Cited

U.S. PATENT DOCUMENTS

| 8,120,178 B2 | 2/2012 | Higuchi et al. |
| 10,224,896 B2 | 3/2019 | Nishimura et al. |

(Continued)

FOREIGN PATENT DOCUMENTS

| JP | 2007267109 A | 10/2007 |
| JP | 2015041785 A | 3/2015 |

(Continued)

OTHER PUBLICATIONS

International Search Report Issued for PCT/JP2018/028311, dated Oct. 16, 2018.

(Continued)

*Primary Examiner* — Jeffrey M Shin
(74) *Attorney, Agent, or Firm* — Arent Fox LLP

(57) ABSTRACT

A resonator that includes a substrate, an insulating film that is formed on the substrate, and vibration regions each of which is formed on the insulating film and includes lower electrodes that are formed on the insulating film, a piezoelectric film that is formed on the lower electrodes, and an upper electrode that is formed on the piezoelectric film. At least one lower electrode of the lower electrodes that are formed on the insulating film has an electric potential that differs from an electric potential of another lower electrode such that at least one vibration region vibrates in antiphase with another vibration region. Moreover, a package seals a resonator and includes the substrate, the insulating film, and the vibration regions and includes a ground terminal for grounding the substrate.

18 Claims, 15 Drawing Sheets

Related U.S. Application Data

(60) Provisional application No. 62/596,289, filed on Dec. 8, 2017.

(51) Int. Cl.
  *H03H 9/10* (2006.01)
  *H03H 9/24* (2006.01)

(52) U.S. Cl.
  CPC ........ *H03H 9/1057* (2013.01); *H03H 9/2452* (2013.01); *H03H 2009/02456* (2013.01)

(56) References Cited

U.S. PATENT DOCUMENTS

| | | | |
|---|---|---|---|
| 2004/0095046 A1* | 5/2004 | Ouchi | G01C 19/5607 310/370 |
| 2007/0164839 A1* | 7/2007 | Naito | H03H 9/02259 333/186 |
| 2007/0227333 A1 | 10/2007 | Higuchi et al. | |
| 2014/0368087 A1 | 12/2014 | Hiraoka et al. | |
| 2016/0329877 A1 | 11/2016 | Nishimura et al. | |
| 2018/0048285 A1 | 2/2018 | Nishimura et al. | |
| 2018/0175794 A1* | 6/2018 | Yamazaki | H01L 41/09 |

FOREIGN PATENT DOCUMENTS

| | | |
|---|---|---|
| WO | 2013114857 A1 | 8/2013 |
| WO | 2015111503 A1 | 7/2015 |
| WO | 2016158056 A1 | 10/2016 |
| WO | 2017203741 A1 | 11/2017 |

OTHER PUBLICATIONS

Written Opinion of the International Searching Authority issued for PCT/JP2018/028311, dated Oct. 16, 2018.

* cited by examiner

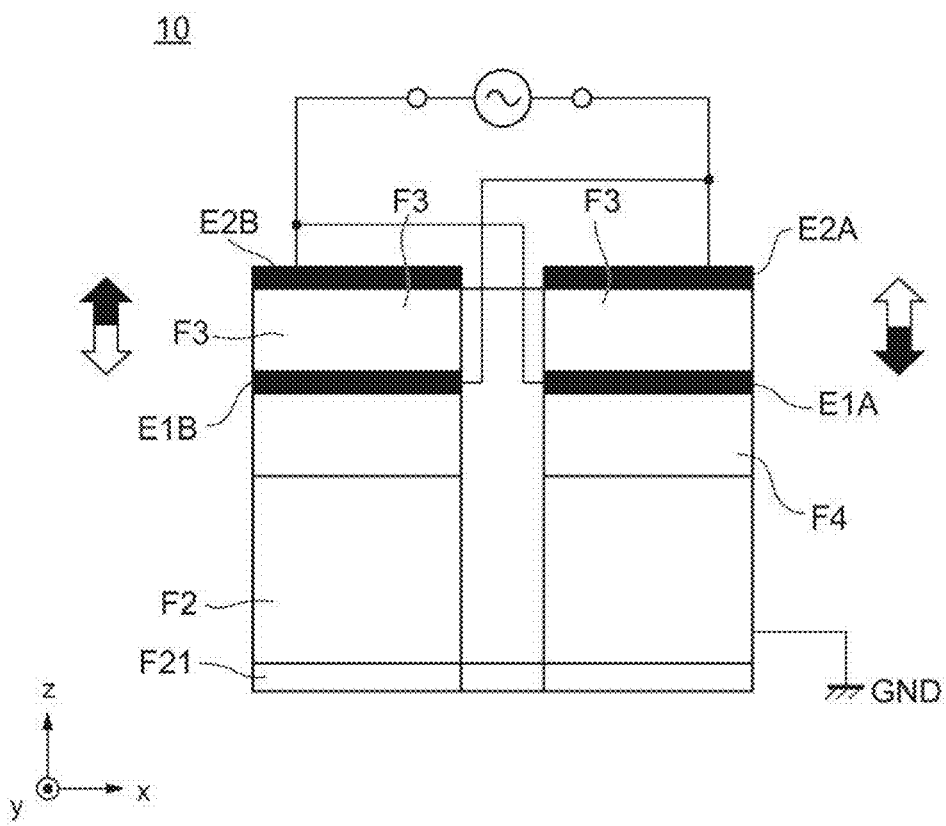

RESONANCE DEVICE

CROSS REFERENCE TO RELATED APPLICATIONS

The present application is a continuation of PCT/JP2018/028311 filed Jul. 27, 2018, which claims priority to U.S. Patent Provisional No. 62/596,289, filed Dec. 8, 2017, the entire contents of each of which are incorporated herein by reference.

TECHNICAL FIELD

The present invention relates to a resonance device.

BACKGROUND

Currently, existing piezoelectric resonance devices for which a MEMS (Micro Electro Mechanical Systems) technique is used are used as a timing device, for example. These piezoelectric resonance devices are mounted on a printed circuit board that is incorporated in an electronic device such as a smart phone.

As the size of an electronic device decreases, the vibration area of the above piezoelectric resonance device needs to be decreased. The decrease in the vibration area results in an increase in resonant resistance, and an oscillation margin decreases. For this reason, it has been considered that the connection form of a vibration region is changed from series connection into parallel connection to ensure capacitance even when the vibration area is small.

For example, Patent Document 1 (identified below) discloses an example of electric connection in a parallel connection structure. As described therein, a MEMS vibrator 1800 of Patent Document 1 includes a silicon layer 1810, an insulating layer 1811, and vibration arms 1812 and 1813. The vibration arm 1812 includes an upper electrode 1820, a lower electrode 1821, and a piezoelectric layer 1822. Similarly, the vibration arm 1813 includes an upper electrode 1830, a lower electrode 1831, and a piezoelectric layer 1832. The electric potential of each electrode is controlled such that the direction of an electric field that is applied to the vibration arm 1812 is opposite the direction of an electric field that is applied to the vibration arm 1813. In the parallel connection structure, the combined capacitance Cf of the MEMS vibrator 1800 is the sum (Cf=Ca1+Ca2) of the electrostatic capacity Ca1 of the vibration arm 1812 and the electrostatic capacity Ca2 of the vibration arm 1813. Accordingly, the combined capacitance Cf can be advantageously increased.

Patent Document 1: International Publication No. 2015/111503.

In the parallel connection structure disclosed in Patent Document 1, the electric potential of the lower electrode 1821 of the vibration arm 1812 differs from the electric potential of the lower electrode 1831 of the vibration arm 1813. The silicon layer 1810 has low resistivity and causes a short circuit when the lower electrodes 1821 and 1831 are directly disposed on the silicon layer 1810. In view of this situation, the insulating layer 1811 is disposed between the lower electrodes 1821 and 1831 and the silicon layer 1810. For this reason, a stray capacitance Cs (=1/(1/Cb1+1/Cb2)) occurs due to a stray capacitance Cb1 between the lower electrode 1821 and the silicon layer 1810 and a stray capacitance Cb2 between the lower electrode 1831 and the silicon layer 1810, and characteristics are degraded in some cases.

SUMMARY OF THE INVENTION

Accordingly, the present invention addresses the foregoing circumstances. Thus, it is an object of the present invention to inhibit characteristics of a piezoelectric resonator that is connected in parallel from decreasing due to a stray capacitance.

In an exemplary aspect, a resonance device includes a substrate, an insulating film formed on the substrate, vibration regions each of which is formed on the insulating film and includes lower electrodes that are formed on the insulating film, a piezoelectric film that is formed on the lower electrodes, and an upper electrode that is formed on the piezoelectric film. Moreover, at least one lower electrode of the lower electrodes that are formed on the insulating film has an electric potential that differs from that of another lower electrode such that at least one vibration region vibrates in antiphase with another vibration region. A package is provided that seals a resonator including the substrate, the insulating film, and the vibration regions and that includes a ground terminal for grounding the substrate.

The exemplary embodiment provides a resonance device that inhibits characteristics of a piezoelectric resonator that is connected in parallel from decreasing due to a stray capacitance.

BRIEF DESCRIPTION OF DRAWINGS

FIG. 4A is a sectional view of FIG. 3 taken along line CC'.

DETAILED DESCRIPTION OF EMBODIMENTS

First Exemplary Embodiment

Figure 1:
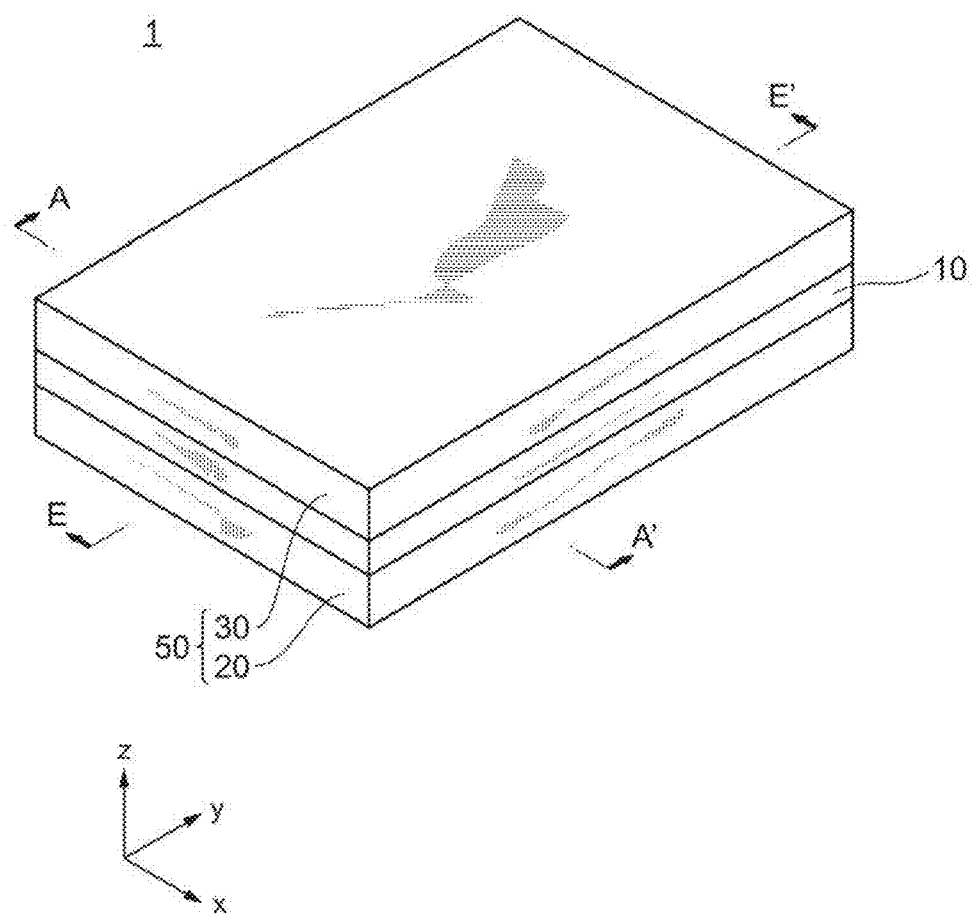
FIG. 1 schematically illustrates a perspective view of a resonance device according to a first exemplary embodiment.
Figure 2:
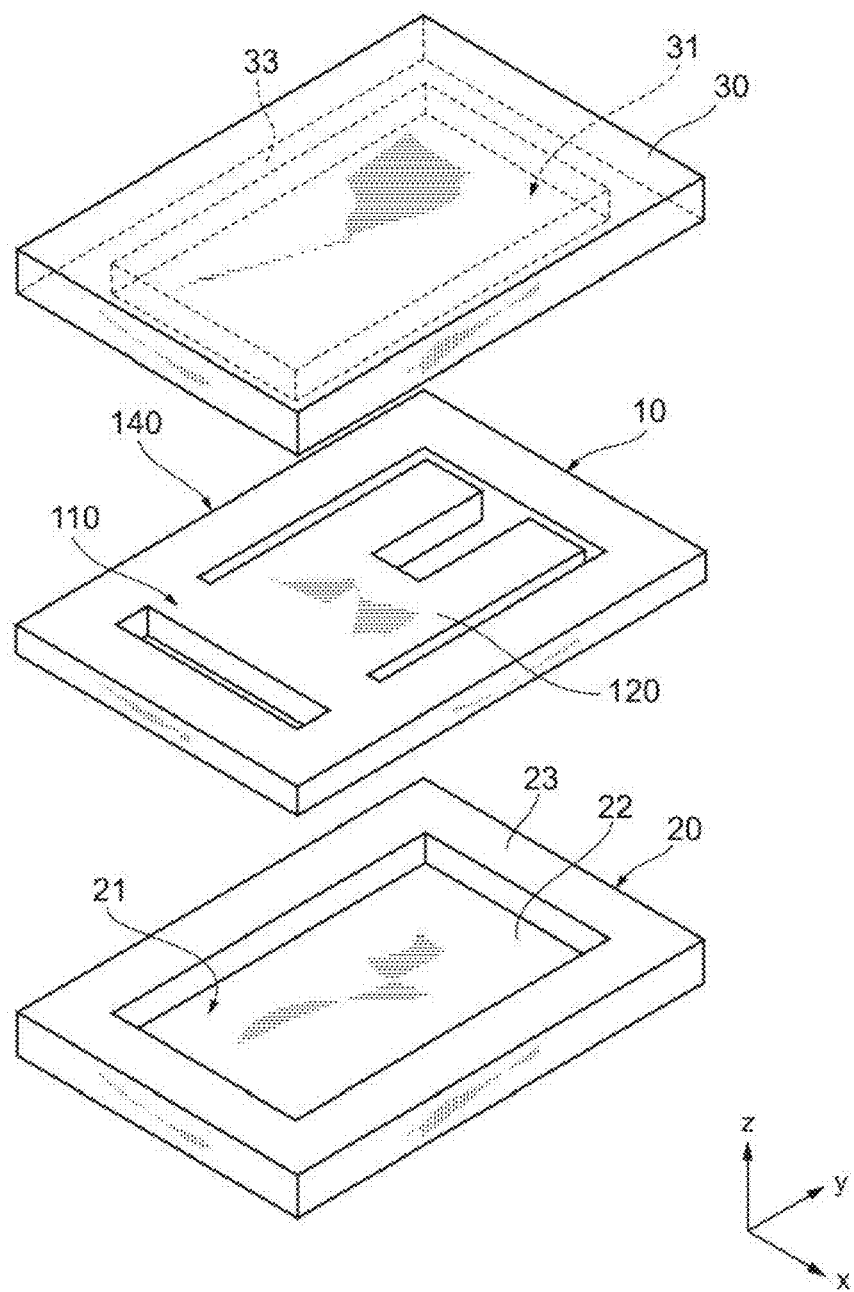
FIG. 2 schematically illustrates an exploded perspective view of the structure of the resonance device according to the first exemplary embodiment.

A first embodiment according to the present invention will be described below with reference to the drawings. FIG. 1 schematically illustrates a perspective view of a resonance device 1 according to the first embodiment of the present invention. FIG. 2 schematically illustrates an exploded perspective view of the structure of the resonance device 1 according to the first exemplary embodiment.

As generally shown, the resonance device 1 includes a lower lid 20, a resonator 10, and an upper lid 30, For purposes of this disclosure, the combination of the lower lid 20 and the upper lid 30 is referred to below as a "package 50". These components are stacked in this order and joined to each other.

According to the exemplary aspect, the resonator 10 is a MEMS vibrator that is manufactured by using a MEMS technique. The resonator 10 and the upper lid 30 are joined to each other, and a joint H (described later) is interposed therebetween. The resonator 10 and the lower lid 20 are formed by using Si substrates. The Si substrates are joined to each other. The resonator 10 is sealed by the upper lid 30, the lower lid 20, a hold member 140 (i.e., a frame) of the resonator 10 described later, and the joint H to form a vibration space in an airtight state. The resonator 10 and the lower lid 20 may be formed by using a SOI substrate according to an exemplary aspect.

The structure of the resonance device 1 will now be described. In the following description, the upper lid 30 of the resonance device 1 is disposed on an upper side (or a front side), and the lower lid 20 is disposed on a lower side (or a back side).

(1. Outline of Structure)
(1-1. Package 50)
(A. Upper Lid 30)

The upper lid 30 extends along a XY plane into a plate shape. On the back surface thereof, a recessed portion 31 in the form of, for example, a flat rectangular cuboid is formed. The recessed portion 31 is surrounded by a side wall 33 and forms a part of the vibration space in which the resonator 10 vibrates. Through-electrodes (not illustrated in FIG. 1 and FIG. 2) are formed in the upper lid 30. In an alternative aspect, the upper lid 30 may not include the recessed portion 31 and may have a plate shape. A getter layer may be formed on a surface of the upper lid 30 near the recessed portion 31.

(B. Lower Lid 20)

The lower lid 20 includes a bottom plate 22 that is disposed along the XY plane and that has a rectangular plate shape and a side wall 23 that extends in a Z-axis direction (that is, a direction in which the lower lid 20 and the resonator 10 are stacked) from a circumferential portion of the bottom plate 22. A recessed portion 21 is formed on a surface of the lower lid 20 that faces the resonator 10 by a front surface of the bottom plate 22 and the inner surface of the side wall 23. The recessed portion 21 forms a part of the vibration space of the resonator 10. The vibration space is sealed in an airtight state by the above upper lid 30, the lower lid 20, the hold member 140, and the joint H, such that a vacuum state is maintained. The vibration space may be filled with gas such as inert gas in an exemplary aspect. The lower lid 20 may not include the recessed portion 21 and may have a plate shape. In addition, a getter layer may be formed on a surface of the recessed portion 21 of the lower lid 20 that faces the resonator 10.

(1-2. Resonator 10)

Figure 3:
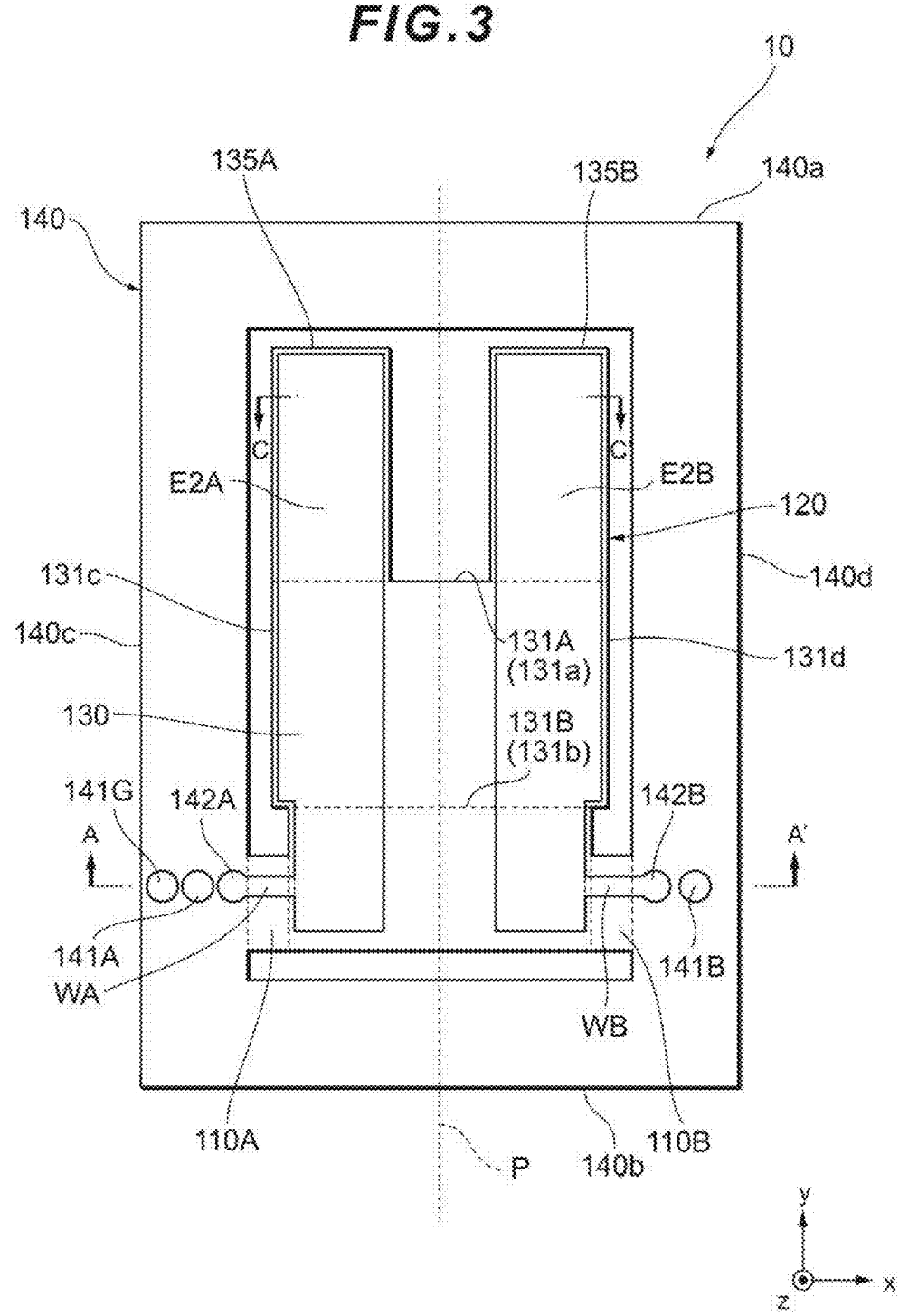
FIG. 3 is a plan view of a resonator according to the first exemplary embodiment.

FIG. 3 schematically illustrates a plan view of the structure of the resonator 10 according to the present embodiment. As described above, the resonator 10 can be a MEMS vibrator that is manufactured by using a MEMS technique, and out-of-plane vibration thereof occurs in the XY plane of a rectangular coordinate system in FIG. 3. The resonator 10 is not limited to a resonator that operates in an out-of-plane bending vibration mode illustrated in FIG. 3 and may operate in a broadened vibration mode, a thickness longitudinal vibration mode, a lamb wave vibration mode, an in-plane bending vibration mode, or a surface acoustic wave vibration mode. These configurations can be used for a timing device, a RF filter, a duplexer, an ultrasonic transducer, a gyro-sensor, or an acceleration sensor. These can also be used for a piezoelectric mirror or a piezoelectric gyro-sensor that has an actuator function or a piezoelectric microphone or an ultrasonic vibration sensor that has a pressure sensor function. These configurations can also be used for an electrostatic MEMS element, an electromagnetic driving MEMS element, or a piezoelectric resistance MEMS element.

The resonator 10 includes a vibration member 120, the hold member 140 (or frame), and hold arms 110A and 110B, which are also referred to below as a "hold arm 110" as a single component.

The vibration member 120 is disposed inside the hold member 140. A space having a predetermined length is formed between the vibration member 120 and the hold member 140. In an example in FIG. 3, the vibration member 120 includes a base 130, two vibration arms 135A and 135B (also referred to as a "vibration arm 135" as a whole), and upper electrodes E2A and E2B. The number of the vibration arms is not limited to 2, but can be set to, for example, a freely selected number of 2 or more, for example. According to the present embodiment, the vibration arm 135 and the base 130 are integrally formed.

The base 130 has long sides 131a and 131b in an X-axis direction and short sides 131c and 131d in a Y-axis direction in a plan view. The long side 131a is a side of a front edge surface 131A (also referred to below as a "front edge 131A") of the base 130. The long side 131b is a side of a rear edge surface 131B (also referred to below as a "rear edge 131B") of the base 130. The front edge 131A and the rear edge 131B of the base 130 face each other.

The base 130 is connected to the vibration arm 135 described later along the front edge 131A and is connected to the hold arm 110 described later along the rear edge 131B. In an example in FIG. 4, the base 130 has a substantially rectangular shape in a plan view but is not limited thereto, provided that the base 130 is substantially plane-symmetrical to an imaginary plane P that is defined as being along the perpendicular bisector of the long side 131a. For example, the base 130 may have a trapezoidal shape in which the long side 131b is shorter than the long side 131a or a semicircular shape a diameter of which coincides with the long side 131a. It is also noted that the surfaces of the base 130 are not limited to a flat surface and may be curved in another aspect. The imaginary plane P passes through the center of the vibration member 120 in the direction of arrangement of the vibration arm 135.

A base length of the base 130 that is the maximum length between the front edge 131A and the rear edge 131B in the direction from the front edge 131A toward the rear edge 131B is about 35 µm in an exemplary aspect. Moreover, a base width that is the maximum length between the side edges of the base 130 in the width direction perpendicular to the direction of the base length is about 265 µm in an exemplary aspect.

The vibration arm 135 extends in the Y-axis direction and has the same size. The vibration arm 135 is arranged in the Y-axis direction between the base 130 and the hold member 140. An end thereof is connected to the front edge 131A of the base 130 and is stationary end, and the other end is an open end opposite thereto. The vibration arm 135 is arranged in parallel at predetermined intervals in the X-axis direction. For example, the width of the vibration arm 135 in the X-axis direction is about 50 µm, and the length thereof in the Y-axis direction is about 465 µm.

As further shown, the upper electrode E2A is formed from the vibration arm 135A to the rear edge 131B of the base 130. On the vibration arm 135A, the upper electrode E2A is formed on the almost entire surface of the vibration arm 135A. The upper electrode E2A is formed on the base 130 with substantially the same width as the width thereof that is formed on the vibration arm 135A.

Similarly, the upper electrode E2B is formed from the vibration arm 135B to the rear edge 131B of the base 130. On the vibration arm 135B, the upper electrode E2B is formed on the almost entire surface of the vibration arm 135B. The upper electrode E2B is formed on the base 130 with substantially the same width as the width thereof that is formed on the vibration arm 135B.

Figure 4B:
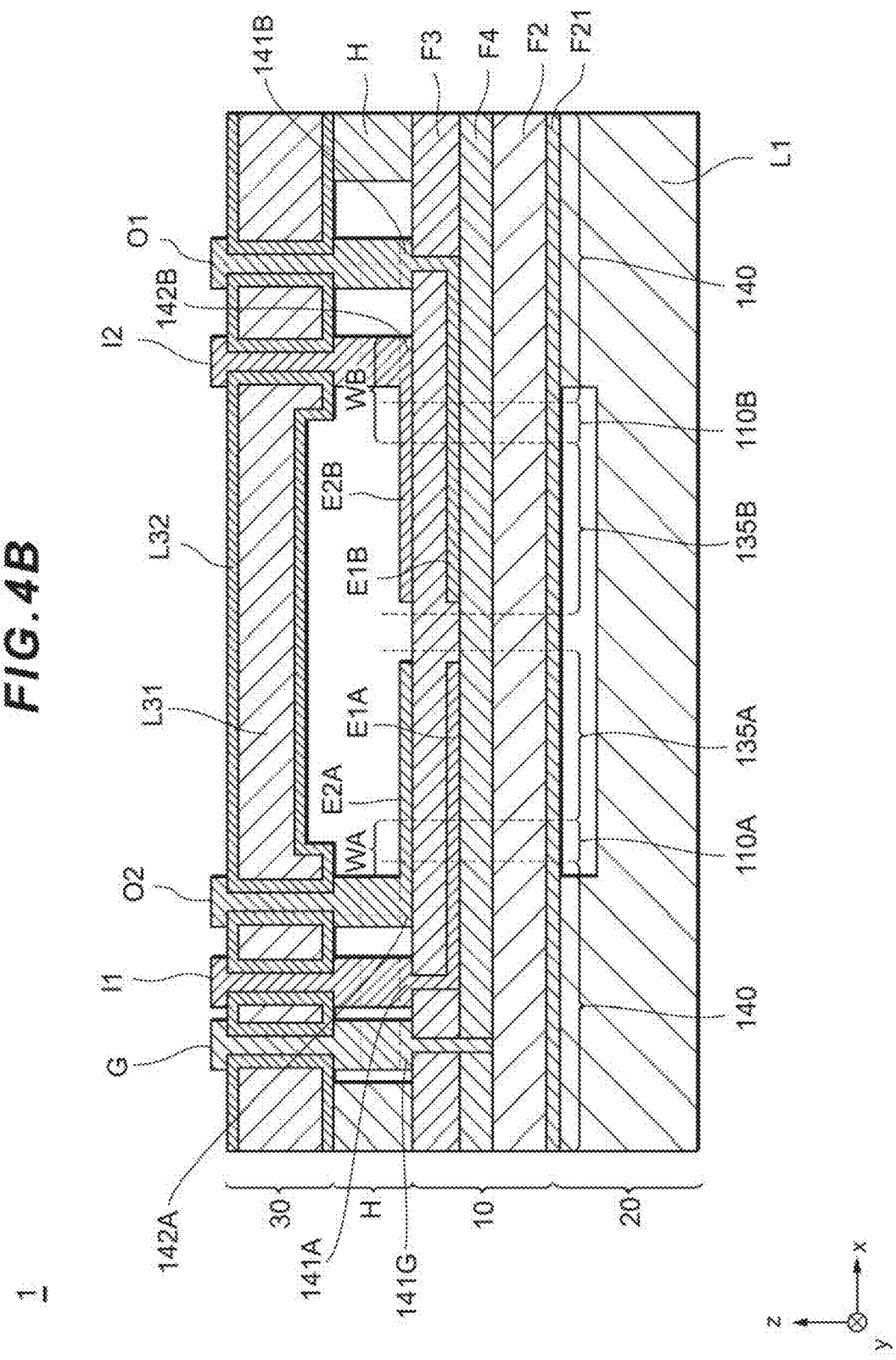
FIG. 4B is a sectional view of FIG. 1 and FIG. 3 taken along line AA'.

FIG. 4A schematically illustrates a section in FIG. 3 taken along line CC'. In the vibration arm 135A, an insulating film F4 is stacked on a Si (silicon) substrate F2, and a lower electrode E1A is stacked on the insulating film F4 so as to cover the insulating film F4. A piezoelectric thin film F3 is stacked on the lower electrode E1A so as to cover the lower electrode E1A. The upper electrode E2A is stacked on the piezoelectric thin film F3. A sectional structure of the vibration arm 135B is the same as that of the vibration arm 135A, and a description thereof is omitted. Each layer will be described in detail later with reference to FIG. 4B.

In operation, the piezoelectric thin film F3 is configured to convert an applied voltage into vibration although this will be described in detail later with reference to FIG. 4B. The piezoelectric thin film F3 expands and contracts in the in-plane direction of the XY plane, that is, the Y-axis direction depending on an electric field that is applied to the piezoelectric thin film F3 by the upper electrode E2A (E2B) and the lower electrode E1A (E1B). The expansion and contraction of the piezoelectric thin film F3 causes the vibration arm 135 to change the position of the free end thereof toward the inner surface of the upper lid 30 and the lower lid 20 and to vibrate in the out-of-plane bending vibration mode.

According to the present embodiment, the phase of an electric field that is applied to the vibration arm 135A is opposite the phase of an electric field that is applied to the vibration arm 135B. That is, the electric fields that are applied to the upper electrode E2A and the upper electrode E2B and the electric fields that are applied to the lower electrode E1A and the lower electrode E1B are in antiphase with each other. Consequently, the vibration arm 135A and the vibration arm 135B shift in opposite directions during operation. For example, when the free end of the vibration arm 135A shifts toward the inner surface of the upper lid 30, the free end of the vibration arm 135B shifts toward the inner surface of the lower lid 20.

According to the present embodiment, a vibration region that is formed by the upper electrode E2A and the lower electrode E1A and a vibration region that is formed by the upper electrode E2B and the lower electrode E1B are separated from each other in the vibration member 120. Moreover, it is reiterated that the number of the vibration regions that are formed in the vibration member 120 is not limited to 2 but may be a freely selected number of 2 or more. According to the present embodiment, the vibration regions are formed depending on the vibration arms, and the number of the vibration arm 135 changes depending on the vibration regions. For example, in the case where five vibration regions are formed in the vibration member 120, the vibration member 120 includes the five vibration arms 135. In this case, variation in antiphase occurs when a voltage that is applied to at least one vibration region is in antiphase with respect to another vibration region.

As further shown, the hold member 140 is formed into a rectangular frame shape along the XY plane. The hold member 140 is disposed so as to surround the vibration member 120 along the XY plane in a plan view. It is only necessary for the hold member 140 to be disposed around at least a part of the vibration member 120 and is not limited to the frame shape. For example, the hold member 140 may be disposed around the vibration member 120 such that the hold member 140 holds the vibration member 120 and can be connected to the upper lid 30 and the lower lid 20.

According to the present embodiment, the hold member 140 includes frame bodies 140a to 140d that are integrally formed and that have a prismatic shape. As illustrated in FIG. 3, the frame body 140a faces the open end of the vibration arm 135, and the longitudinal direction thereof is parallel to the X-axis. The frame body 140b faces the rear edge 131B of the base 130, and the longitudinal direction thereof is parallel to the X-axis. The frame body 140c faces the side edge (i.e., the short side 131c) of the base 130 and the vibration arm 135A, the longitudinal direction thereof is parallel to the Y-axis, and ends thereof are connected to ends of the frame bodies 140a and 140b. The frame body 140d faces the side edge (i.e., the short side 131d) of the base 130 and a vibration arm 135B, the longitudinal direction thereof is parallel to the Y-axis, and ends thereof are connected to the other ends of the frame bodies 140a and 140b.

Voltage applicators 141G, 141A, and 142A are formed in this order from the outside in a region near contact between the frame body 140c and the hold arm 110. The voltage applicators 141A and 142A are connected to an external power supply and can apply an alternating electric field to the lower electrode E1A and the upper electrode E2A.

The hold arm 110A is disposed inside the hold member 140 and connects the vibration member 120 and the frame body 140c of the hold member 140 to each other. A wiring line WA that connects the upper electrode E2A and the voltage applicator 142A to each other is formed on a surface of the hold arm 110A. The hold arm 110B is disposed inside the hold member 140 and connects the vibration member 120 and the frame body 140d of the hold member 140 to each other. A wiring line WB that connects the upper electrode E2B and a voltage applicator 142B to each other is formed on a surface of the hold arm 110B.

(2. Multilayer Structure)

The multilayer structure of the resonance device 1 will be described with reference to FIG. 4B. it is noted that FIG. 4B is a sectional view of FIG. 1 taken along line AA'. A section in FIG. 1 taken along line AA' corresponds to a section in FIG. 3 taken along line AA'. In the resonance device 1 according to the present embodiment, as illustrated in FIG.

4B, the hold member 140 of the resonator 10 is joined to the side wall 23 of the lower lid 20, and the hold member 140 of the resonator 10 and the side wall 33 of the upper lid 30 are joined to each other. The resonator 10 is thus held between the lower lid 20 and the upper lid 30. The vibration space in which the vibration arm 135 vibrates is formed by the lower lid 20, the upper lid 30, and the hold member 140 of the resonator 10.

(2-1. Upper Lid 30)

The upper lid 30 is formed by using a Si (silicon) wafer L3 having a predetermined thickness. As illustrated in FIG. 4B, the upper lid 30 is joined to the hold member 140 of the resonator 10 at the joint H described later along a circumferential portion (the side wall 33) thereof. The front surface and the back surface of the upper lid 30 that faces the resonator 10 and side surfaces of through-electrodes V3 are preferably covered by a silicon oxide film L31, for example. The silicon oxide film L31 is formed on a front surface of the Si wafer L3 by, for example, oxidation of the front surface of the Si wafer L3 or chemical vapor deposition (CVD).

A getter layer 34 is formed on the surface of the recessed portion 31 of the upper lid 30 that faces the resonator 10. The getter layer 34 is composed of, for example, Ti (titanium) and is configured to absorb a gas outgassing in the vibration space that is defined by the upper lid 30 and the lower lid 20. The getter layer may be formed on the almost entire surface of the recessed portion 31 of the upper lid 30 that faces the resonator 10 although this is not illustrated. This enables the outgassing gas to be sufficiently absorbed, and a vacuum in the vibration space can be maintained.

Through-electrodes G, I1, I2, O1, and O2 of the upper lid 30 are formed by filling through-holes that are formed in the upper lid 30 with metal such as polycrystalline silicon (Poly-Si).

The through-electrode G is a ground terminal that connects the Si substrate F2 of the resonator 10 described later to the ground.

The through-electrode I1 electrically connects a metal layer E1 of the resonator 10 described below to an external input power supply or input signal. The through-electrode I2 electrically connects a metal layer E2 of the resonator 10 described below to an external input power supply or input signal.

The through-electrode O1 electrically connects the metal layer E1 of the resonator 10 described below to an external output power supply or output signal. The through-electrode O2 electrically connects the metal layer E2 of the resonator 10 described below to an external output power supply or output signal.

In an exemplary aspect, Al films or Mo films are formed between the through-electrodes G, I1, I2, O1, and O2 and the resonator 10, for example.

(2-2. Lower Lid 20)

The bottom plate 22 and the side wall 23 of the lower lid 20 are integrally formed by using a Si (silicon) wafer L1. The lower lid 20 is joined to the hold member 140 of the resonator 10 along the upper surface of the side wall 23. The thickness of the lower lid 20 in the Z-axis direction is, for example, 150 μm. The depth of the recessed portion 21 is, for example, 50 μm. The Si wafer L1 is composed of silicon that is not degenerate, and the resistivity thereof is, for example, 16 mΩ·cm or more.

(2-3. Resonator 10)

The hold member 140, the base 130, the vibration arm 135, and the hold arm 110 of the resonator 10 are integrally formed in the same manufacturing process, for example. In the resonator 10, the insulating film F4 is stacked on the Si (silicon) substrate F2 (that is an example of the substrate). The lower electrodes E1A and E1B (also referred to bellow as the "metal layer E1") are stacked on the insulating film F4. The piezoelectric thin film F3 is stacked on the metal layer E1 so as to cover the metal layer E1. The upper electrodes E2A and E2B, the wiring lines WA and WB, the voltage applicators 142A and 142B (also referred to below as the "metal layer E2" as a whole) are stacked on the piezoelectric thin film F3. A protection film may be stacked on the metal layer E2 so as to cover the metal layer E2.

The Si substrate F2 is composed of, for example, degenerate n-type Si semiconductor having a thickness of about 6 μm and can contain a n-type dopant such as P (phosphorus), As (arsenic), or Sb (antimony). The resistance value of degenerate Si that is used for the Si substrate F2 is, for example, less than 16 mΩ·cm, preferably 1.2 mΩ·cm or less. According to the present embodiment, the material of the Si substrate F2 is not limited to degenerate silicon provided that the material is a semiconductor having a low resistance. Moreover, a silicon oxide (for example, $SiO_2$) layer F21 (that is an example of a layer for compensating temperature characteristics) is formed on the lower surface of the Si substrate F2. This configuration improves the temperature characteristics. The silicon oxide layer F21 may be formed on the upper surface of the Si substrate F2 or the silicon oxide layers F21 may be formed on the upper surface and the lower surface of the Si substrate F2.

The insulating film F4 is preferably composed of, for example, a thermally conductive material that has a thickness of no less than 50 μm and no more than 500 μm and that has a low dielectric constant. Specifically, the material of the insulating film F4 preferably has a thermal conductivity of 100 W/km or more, and examples thereof preferably include SiN (silicon nitride), AlN, diamond, and sapphire. The insulating film F4 that is formed between the Si substrate F2 and the metal layer E1 prevents a short circuit of the separated metal layer E1 from occurring.

The use of a thermally conductive material that has a low dielectric constant for the insulating film F4 inhibits TED (Thermoelastic Dumping) and inhibits Q of the resonator 10 from decreasing when the bending vibration of the vibration member 120 occurs. The TED means an energy loss due to a difference in temperature between a tensile region and a compression region in vibration of the resonator 10. In particular, when the thermal conductivity of an intermediate layer in the stacking direction of the vibration member 120 is high, the TED of the resonator 10 at a low frequency can be inhibited. In the case of a multilayer structure as in the resonator 10 according to the present embodiment, the insulating film F4 between the piezoelectric thin film F3 and the Si substrate F2 greatly affects the TED. Accordingly, the use of a thermally conductive material that has a low dielectric constant for the insulating film F4 enables the TED to be efficiently inhibited.

According to an exemplary aspect, the metal layers E2 and E1 are composed of, for example, Mo (molybdenum) or aluminum (Al) having a thickness of no less than 0.1 μm and no more than 0.2 μm.

The metal layers E2 and E1 are formed into a desired shape by, for example, etching. The metal layer E1, for example, on the vibration member 120 functions as the lower electrodes E1A and E1B. The metal layer E1 on the hold arm 110 or the hold member 140 functions as a wiring line that connects the lower electrodes to an AC power supply that is disposed outside the resonator 10.

The metal layer E2 on the vibration member 120 is configured to function as the upper electrodes E2A and E2B.

Moreover, the metal layer E2 on the hold arm 110 or the hold member 140 is configured to function as the wiring lines WA and WB that connect the upper electrodes to a circuit that is disposed outside of the resonator 10.

The piezoelectric thin film F3 converts an applied voltage into vibration, and the main component thereof can be, for example, nitride such as AlN (nitride aluminum) or an oxide. Specifically, the piezoelectric thin film F3 can be composed of ScAlN (scandium aluminum nitride). ScAlN is obtained by replacing a part of aluminum in nitride aluminum with scandium. The piezoelectric thin film F3 has a thickness of, for example, 1 μm and can have a thickness of about 0.2 μm to 2 μm.

In regions of the hold member 140 on which the through-electrodes I1 and O1 are formed (that is, the voltage applicators 141A and 141B), the piezoelectric thin film F3 is removed such that the electrode layer E1 is exposed. Metal such as Al is filled at locations at which the piezoelectric thin film F3 is removed to form wiring lines that connect the through-electrodes I1 and O1 and the metal layer E1 to each other. In a region of the hold member 140 on which the through-electrode G is formed (that is, the voltage applicator 141G), the piezoelectric thin film F3 and the insulating film F4 are removed such that the Si substrate F2 is exposed. Metal such as Al is filled at locations at which the piezoelectric thin film F3 and the insulating film F4 are removed to form a wiring line that grounds the Si substrate F2 with the through-electrode G interposed therebetween.

(2-5 Joint)

The joint H is formed into an annular rectangle shape along the XY plane between the resonator 10 and the upper lid 30. The joint H is configured to provide eutectic coupling between the resonator 10 and the upper lid 30 and seals the vibration space of the resonator 10. The joint H is formed by, for example, an Al layer and a Ge layer.

(3. Effects)

Figure 5A:
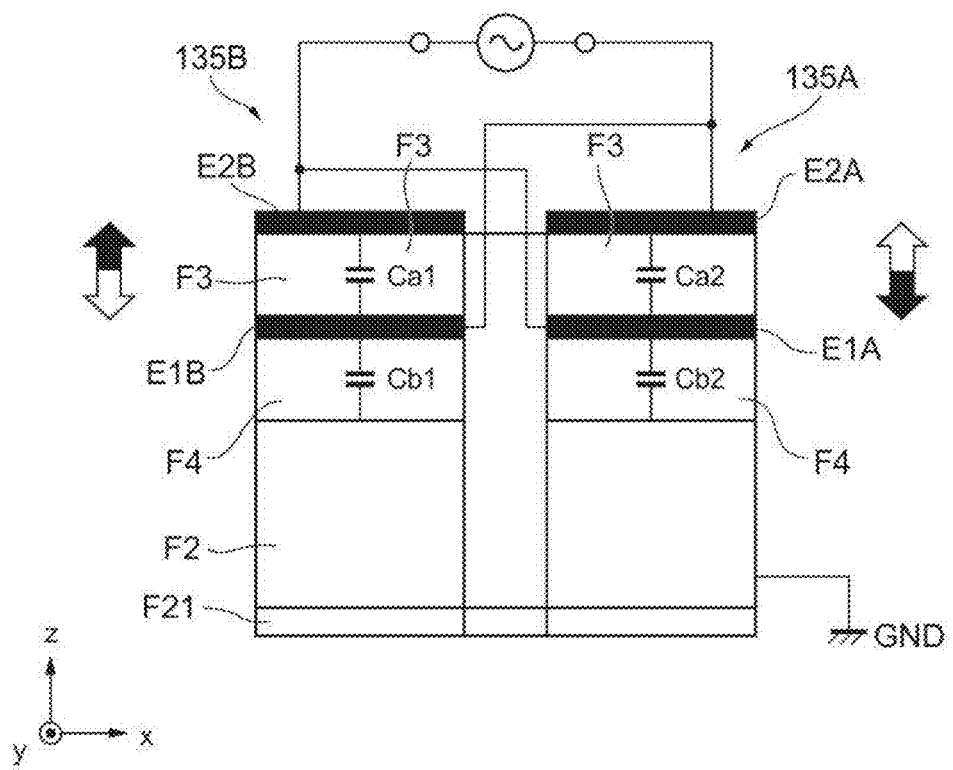
FIG. 5A is a schematic diagram for a description of the function of the resonance device according to the first exemplary embodiment.
Figure 5B:
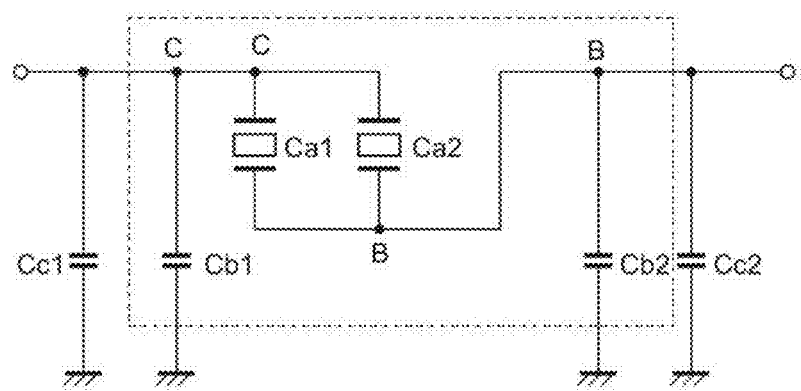
FIG. 5B is a schematic diagram for the description of the function of the resonance device according to the first exemplary embodiment.
Figure 6A:
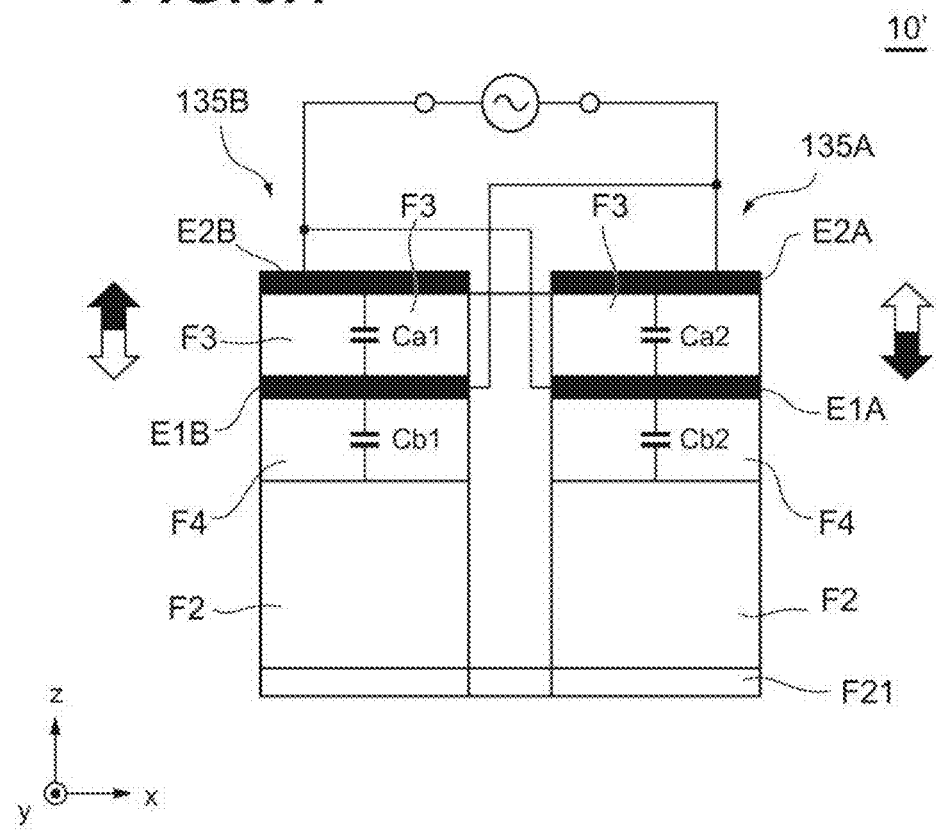
FIG. 6A is a schematic diagram for the description of the function of the resonance device according to the first exemplary embodiment.
Figure 6B:
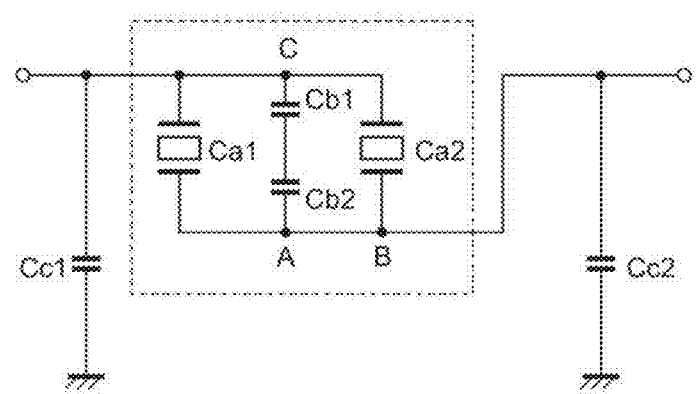
FIG. 6B is a schematic diagram for the description of the function of the resonance device according to the first exemplary embodiment.

The effects of the resonance device 1 according to the present embodiment will now be described with reference to FIG. 5A to FIG. 8. FIG. 5A, FIG. 5B, FIG. 6A, and FIG. 6B illustrate the connection form of the resonator 10 according to the present embodiment. FIG. 5A schematically illustrates a section in FIG. 3 taken along line CC'. FIG. 5B illustrates an equivalent circuit to FIG. 5A. FIG. 6A corresponds to FIG. 5A and illustrates the connection form of a resonator 10' in a comparative example. FIG. 6B illustrates an equivalent circuit to FIG. 6A. The resonator 10' in the comparative example differs from the resonator 10 in that the Si substrate F2 of the resonator 10 is not grounded. The other structures are the same as those of the resonator 10.

Referring to FIG. 6A and FIG. 6B, when a voltage is applied to the piezoelectric thin film F3 of the resonator 10' in the comparative example, the Si substrate F2 and the metal layer E1 become charged, and stray capacitances Cb1 and Cb2 occur in the insulating film F4. In a Colpitts oscillation circuit such as the resonator 10 according to the present embodiment, an oscillation circuit is formed by an inverter (not illustrated), additional capacitances Cc1 and Cc2, and L-properties (inductive properties) of the resonator. In FIG. 6B, the L-properties are illustrated by being surrounded by a dashed line. In the resonator 10' in the comparative example, as illustrated in FIG. 6B, capacitance components of the insulating film F4 are inserted in parallel as the stray capacitances Cb1 and Cb2 in the resonator 10'. Consequently, a coupling coefficient of resonance characteristics of the resonator 10' seemingly decreases. The decrease in the coupling coefficient of the resonator 10' decreases an oscillation margin due to variation in capacitance of the additional capacitances Cc1 and Cc2 and the inverter. Consequently, the characteristics of the resonator 10' are degraded.

The Si substrate F2 of the resonator 10 according to the present embodiment is grounded (FIG. 5A). Consequently, as illustrated in FIG. 5B, the capacitances Cb1 and Cb2 that occur in the insulating film F4 function as additional capacitances. Moreover, the capacitance of the resonator 10 itself does not increase, the coupling coefficient can be prevented from decreasing, and the oscillation margin can be increased. In addition, the capacitances Cb1 and Cb2 can be used as the additional capacitances, and the additional capacitances Cc1 and Cc2, for example, can be decreased. In this case, a size can be further decreased.

Figure 7:
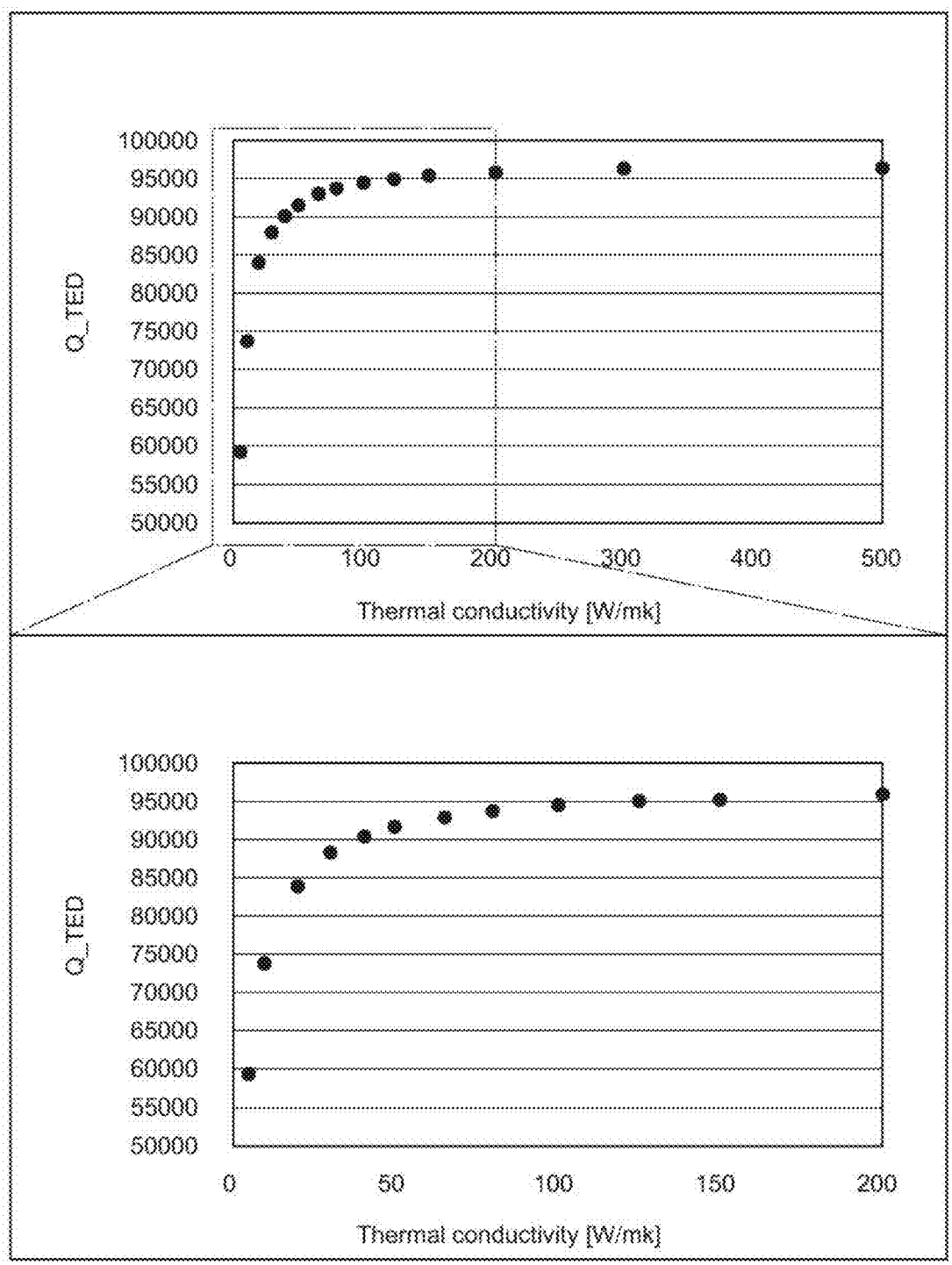
FIG. 7 is a graph for the description of the function of the resonance device according to the first exemplary embodiment.

The effects of the use of a thermally conductive material that has a low dielectric constant for the insulating film F4 will now be described with reference to FIG. 7. FIG. 7 is a graph illustrating the result of a simulation in which the effects of the TED on the Q is measured in the case where a material having low dielectric properties is used for the insulating film F4, and only the thermal conductivity of the material is changed. In FIG. 7, the horizontal axis represents the thermal conductivity of the material, and the vertical axis represents the Q due to the TED. In the simulation in FIG. 7, a resonator that includes a single vibration arm is used.

As illustrated in FIG. 7, the use of a material having a high thermal conductivity, particularly, a thermal conductivity of 20 W/mk or more for the insulating film F4 inhibits the TED from decreasing.

In the resonance device 1 according to the present embodiment, the Si substrate F2 of the resonator 10 is grounded as above. This enables a stray capacitance that occurs in the insulating film F4 to be used as an additional capacitance. Consequently, the capacitance of the resonator 10 itself does not increase, the coupling coefficient can be prevented from decreasing, and the oscillation margin can be increased.

The use of a thermally conductive material having a low dielectric constant for the insulating film F4 inhibits the TED and inhibits the Q of the resonator 10 from decreasing when the bending vibration of the vibration member 120 occurs.

Second Exemplary Embodiment

According to a second embodiment and later, a description of matters common to those according to the first embodiment is omitted, and only different matters will be described. In particular, the same effects achieved by the same structures are not described for every embodiment and will be appreciated to those skilled in the art.

A resonator 11 according to the second embodiment will be described with reference to FIG. 8 to FIG. 10. Among the components of the resonator 11, components like to those of the resonator 10 according to the first embodiment are designated by like reference characters, and a description thereof is omitted.

Figure 8:
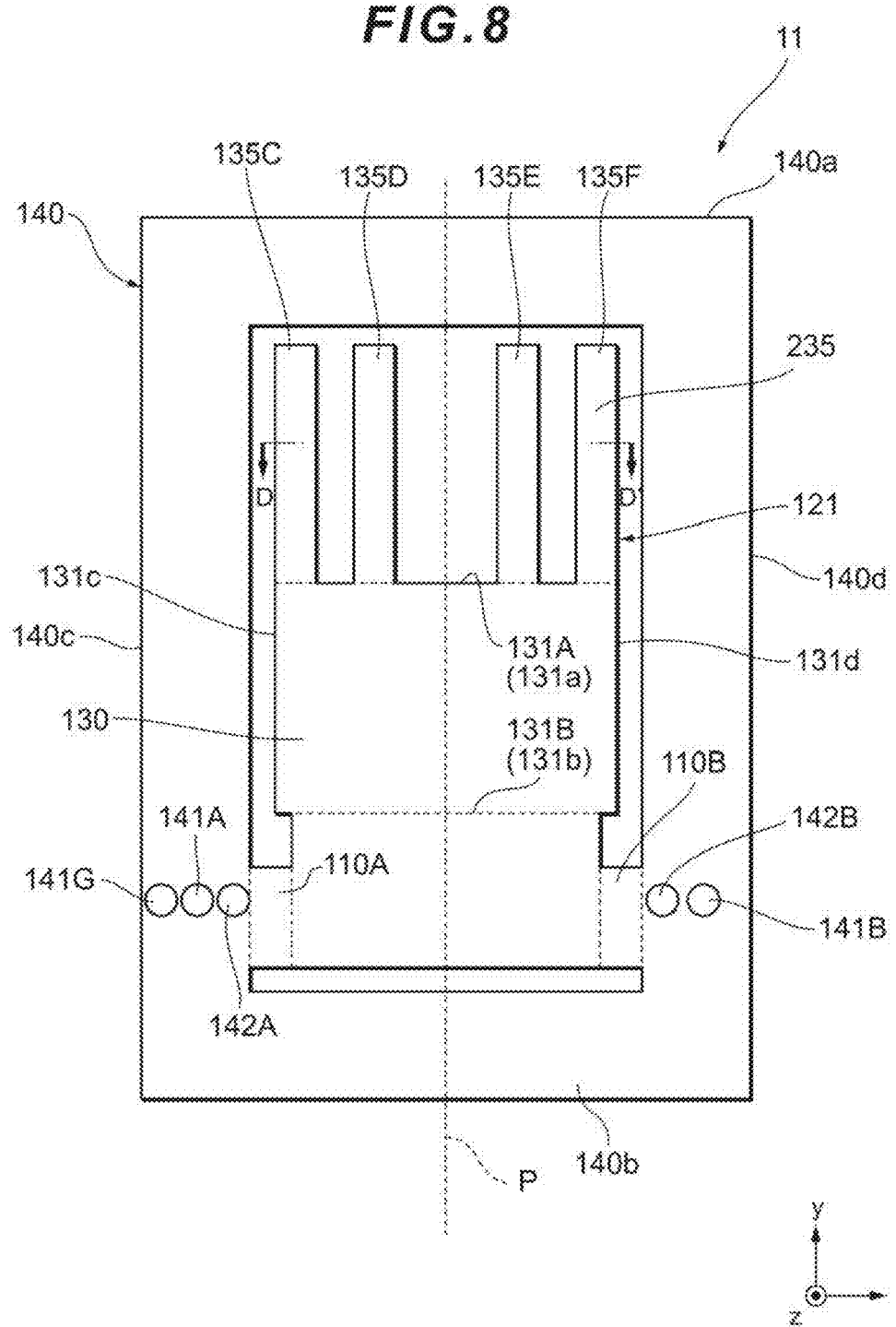
FIG. 8 is a plan view of a resonator according to a second exemplary embodiment.

FIG. 8 is a plan view of the resonator 11. FIG. 9 schematically illustrates a section in FIG. 8 taken along line DD'. Referring to FIG. 8, the resonator 11 according to the present embodiment includes a vibration member 121 instead of the vibration member 120.

The vibration member 121 includes vibration arms 135C to 135F instead of the two vibration arms 135A and 135B. In the vibration member 121 according to the present embodiment, the two vibration arms 135C and 135F are disposed on the outside in the X-axis direction, and the two vibration arms 135D and 135E are disposed on the inside. A first distance in the X-axis direction between the vibration arms 135D and 135E is longer than a second distance in the X-axis direction between the vibration arm 135C (135F) on the outside and the vibration arm 135D (135E) that is located on the inside and that is adjacent to the vibration arm 135C (135F) on the outside. The first distance is, for example, about 35 μm. The second distance is, for example, about 25 μm. The second distance that is shorter than the first distance enables vibration characteristics to be improved. The first distance may be shorter than the second distance such that the size of the resonance device 1 can be decreased. The distances may be equal to each other.

According to the present embodiment, a protection film 235 is formed on a surface (i.e., the surface that faces the upper lid 30) of the vibration member 121 so as to cover the entire surface thereof. The protection film 235 are removed at locations on the voltage applicators 141G, 141A, 142A, 141B, and 142B.

Figure 9:
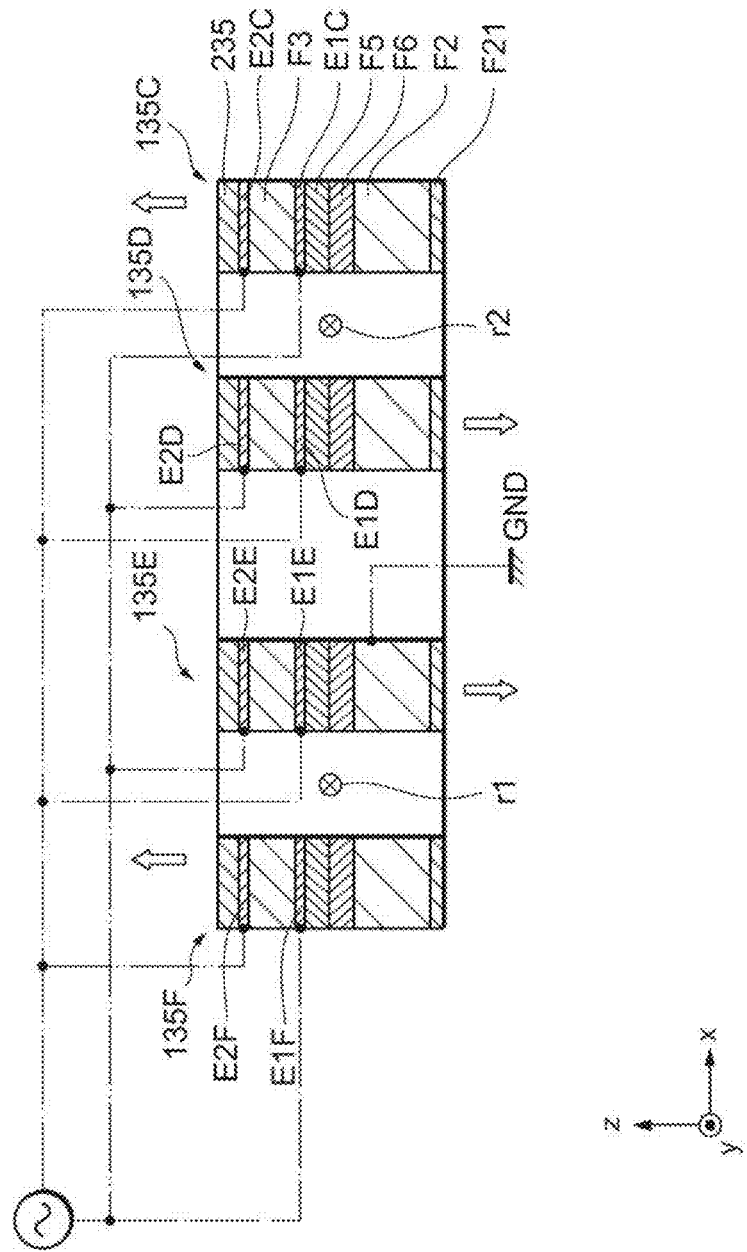
FIG. 9 is a sectional view of FIG. 8 taken along line DD'.

Referring to FIG. 9, the phase of an electric field that is applied to the vibration arms 135C and 135F of the vibration member 121 on the outside is opposite the phase of an electric field that is applied to the vibration arms 135D and 135E on the inside. Consequently, the vibration arms 135C and 135F on the outside and the vibration arms 135D and 135E on the inside shift in opposite directions. For example, when the open ends of the vibration arms 135C and 135F on the outside shift toward the inner surface of the upper lid 30, the open ends of the vibration arms 135D and 135E on the inside shift toward the inner surface of the lower lid 20.

Consequently, in the resonator 11 according to the present embodiment, vibration in antiphase occurs, that is, the vibration arm 135C and the vibration arm 135D vibrate in opposite vertical directions about a central axis r1 extending in the Y-axis direction between the vibration arm 135C and the vibration arm 135D illustrated in FIG. 9. The vibration arm 135E and the vibration arm 135F vibrate in opposite vertical directions about a central axis r2 extending in the Y-axis direction between the vibration arm 135E and the vibration arm 135F. This creates twisting moments in opposite directions about the central axes r1 and r2, and the bending vibration of the base 130 occurs.

That is, in the vibration member 121, a vibration region that is formed by the upper electrode E2C and the lower electrode E1C, a vibration region that is formed by the upper electrode E2D and the lower electrode E1D, a vibration region that is formed by the upper electrode E2E and the lower electrode E1E, and a vibration region that is formed by the upper electrode E2F and the lower electrode E1F are separated from each other.

The resonator 11 includes insulating films F5 and F6 instead of the insulating film F4. The insulating film F5 is composed of a material having low dielectric properties such as a silicon oxide, for example. The insulating film F6 is composed of a material having a high thermal conductivity such as AlN. The thicknesses of the insulating films F5 and F6 are about 150 nm.

The degree of freedom of selection of the material is increased by replacing the insulating film F4 according to the first embodiment with the insulating films F5 and F6 of two layers as above. FIG. 10 is a graph illustrating the result of a simulation in which the amount of variation in the Q due to the TED depending on temperature is measured in the case where a film that has a single layer and that is composed of a low dielectric constant material is used as an insulating film (plotted by white circles) and in the case where a film that has two layers of a low dielectric constant material layer and a high thermal conductivity material layer is used (plotted by black circles). In FIG. 10, the horizontal axis represents the temperature, and the vertical axis represents the variation in the Q due to the TED.

Figure 10:
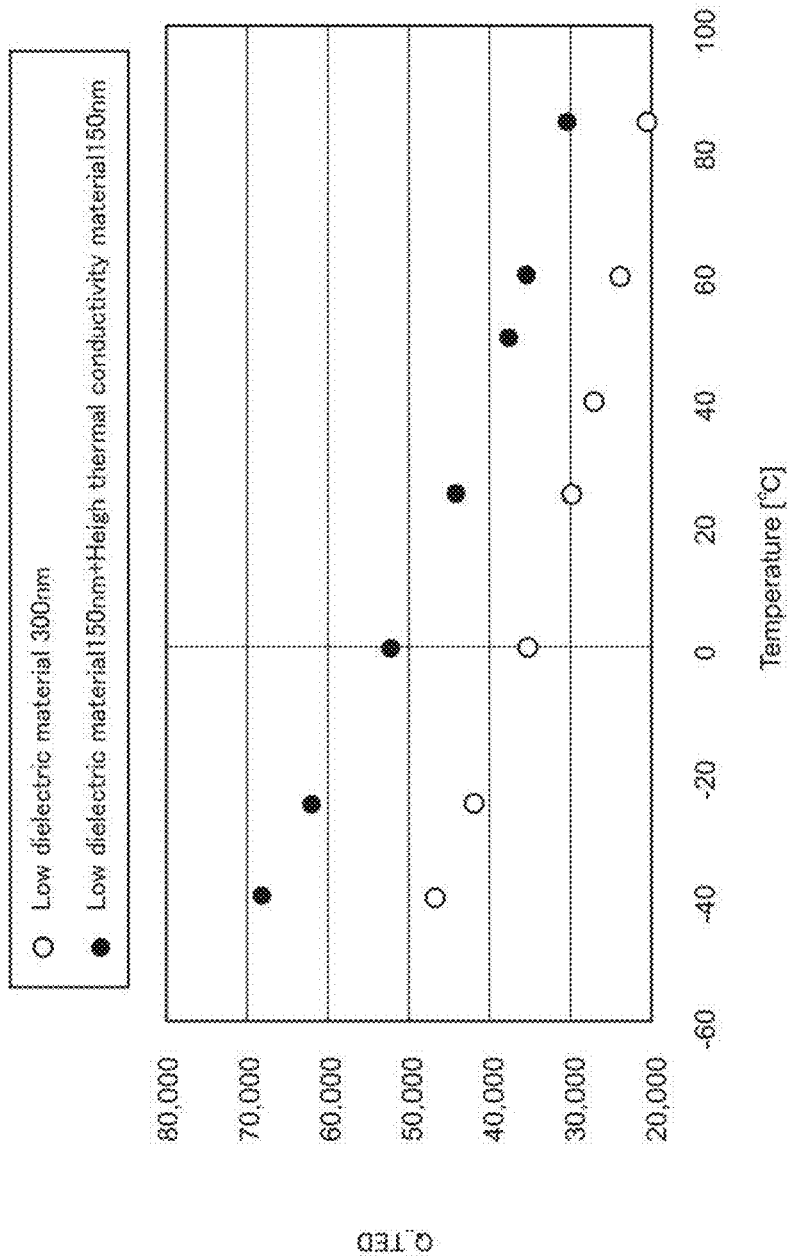
FIG. 10 is a graph for the description of the function of the resonance device according to the first exemplary embodiment.

As is clear from FIG. 10, the degradation of the Q due to the TED depending on the temperature in the case where the film that has the two layers of the low dielectric constant material layer and the high thermal conductivity material layer is used can be inhibited more than in the case where the film that has the single layer and that is composed of the low dielectric constant material is used.

The resonator 11 according to the present embodiment thus inhibits the TED by using, as the insulating films, the film that has the two layers of the low dielectric constant material layer and the high thermal conductivity material layer. Other structures and functions are the same as those according to the first embodiment.

Third Exemplary Embodiment

Figure 11:
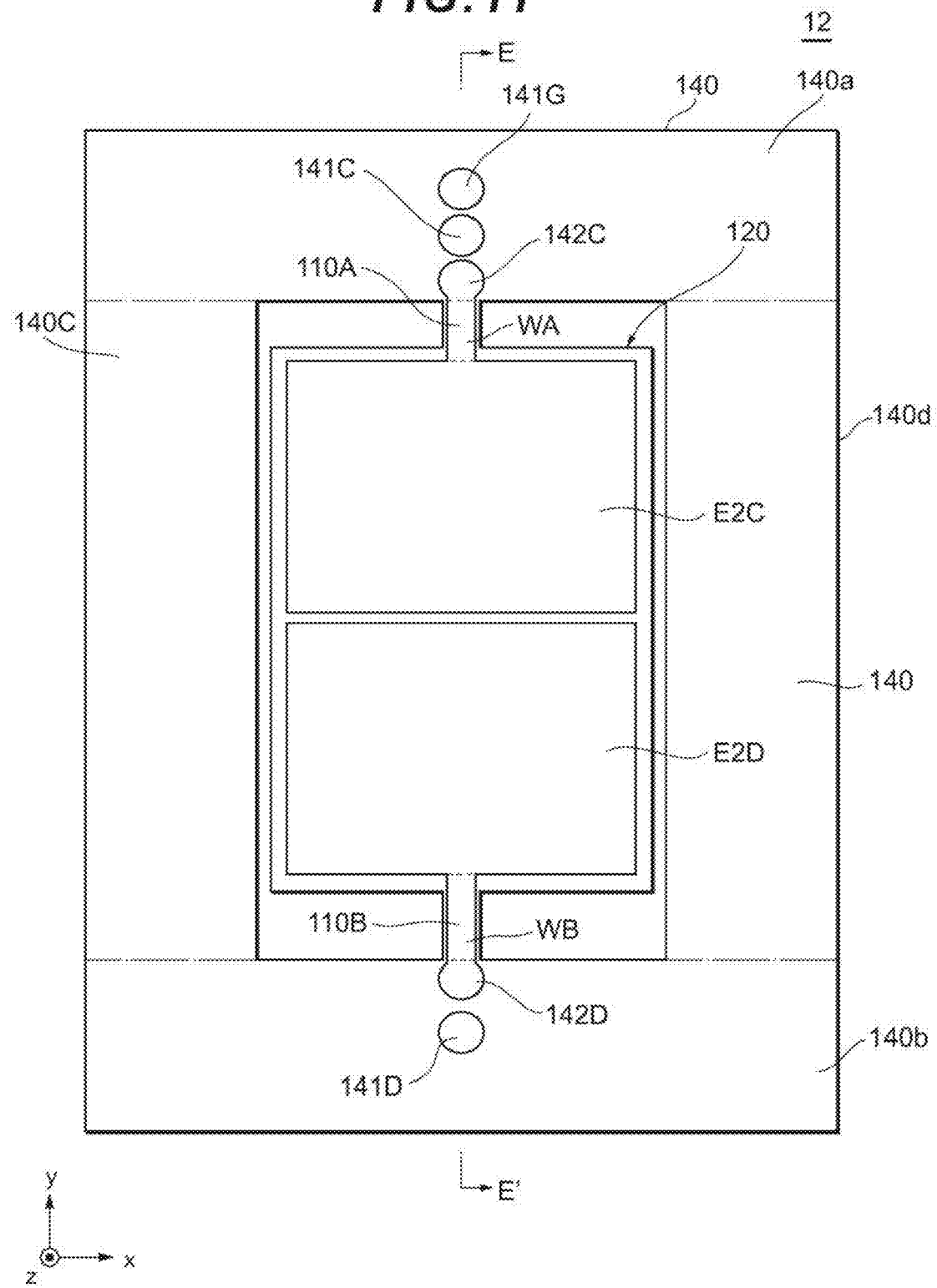
FIG. 11 is a plan view of a resonator according to a third exemplary embodiment.
Figure 12:
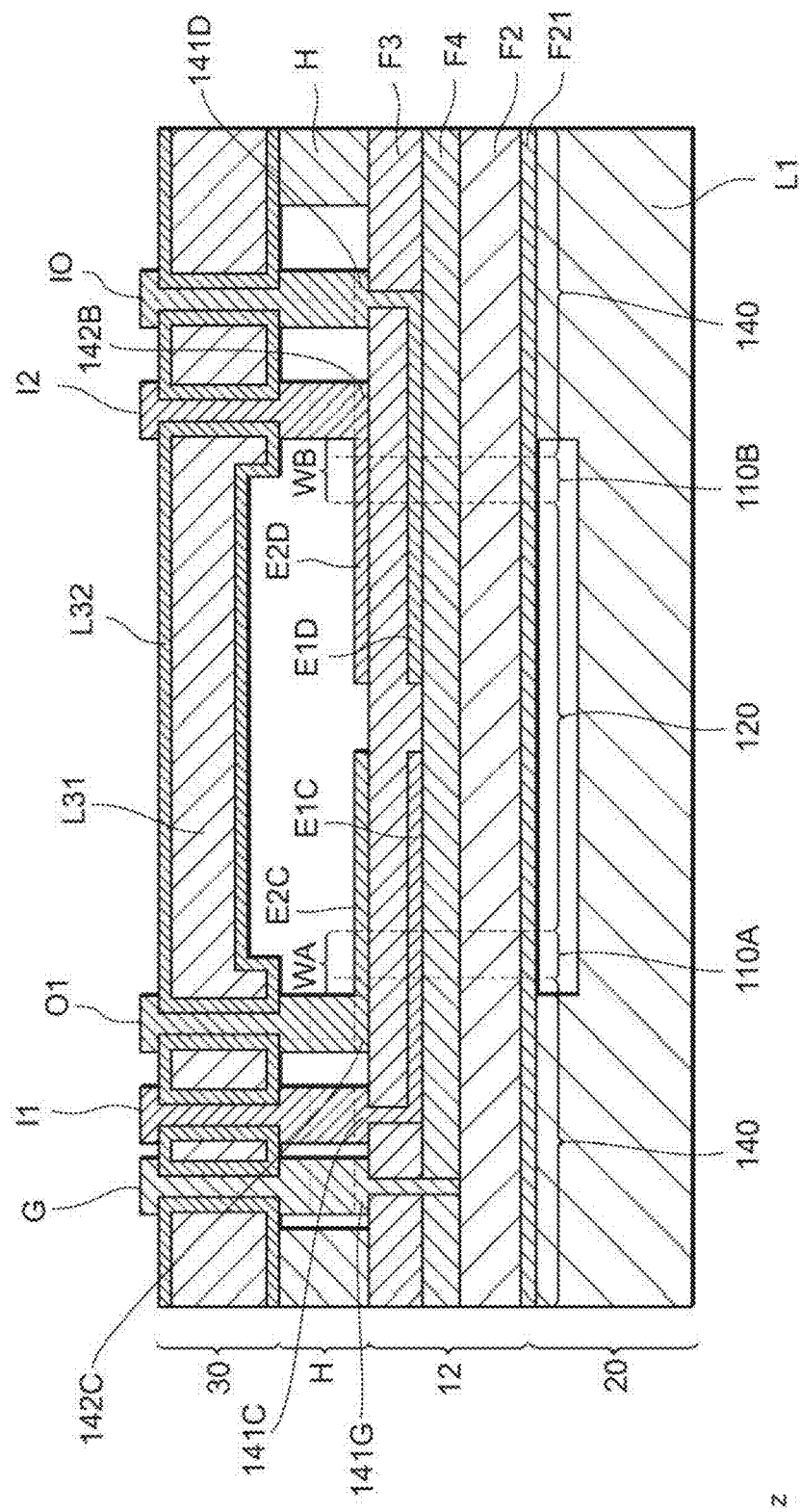
FIG. 12 is a sectional view of FIG. 1 and FIG. 11 taken along line EE'.

Differences between a resonator 12 according to a third embodiment and that according to the first embodiment will be described with reference to FIG. 11 and FIG. 12. FIG. 11 is a plan view of the resonator 12 according to the present embodiment. FIG. 12 schematically illustrates an example of a sectional structure of FIG. 11 taken along line EE'. A section in FIG. 12 corresponds to a section in FIG. 11 taken along line EE'.

According to the present embodiment, the resonator 12 is an in-plane vibrator that causes contour vibration in the XY plane. The resonator 12 includes a vibration member 122 instead of the vibration member 120.

The vibration member 122 has a substantially rectangular cuboid contour that extends along the XY plane of a rectangular coordinate system in FIG. 11 into a plate shape. The vibration member 122 has short sides in the X-axis direction and long sides in the Y-axis direction. The vibration member 122 is held by the hold arms 110A and 110B of the hold member 140 (e.g., the frame bodies 140c and 140d) along the short sides.

Upper electrodes E2C and E2D are formed on a surface (e.g., surface that faces the upper lid 30) of the vibration member 122 so as to halve the surface in the direction of the long sides of the vibration member 122. Referring to FIG. 12, the upper electrodes E2C and E2D face lower electrodes E1C and E1D that are separated with the piezoelectric thin film F3 interposed therebetween. Consequently, in the vibration member 122, a vibration region that is formed by the upper electrode E2C and the lower electrode E1C and a vibration region that is formed by the upper electrode E2D and the lower electrode E1D are separated from each other.

Each vibration region of the vibration member 122 has a vibration node in a direction parallel to the short sides of the vibration member 122. The vibration region has a rectangular shape that has long sides parallel to the vibration node (that is, parallel to the short sides of the vibration member 122) and short sides corresponding to the half wave length of the contour vibration. Other structures and functions are the same as those according to the first embodiment.

Fourth Exemplary Embodiment

Figure 13:
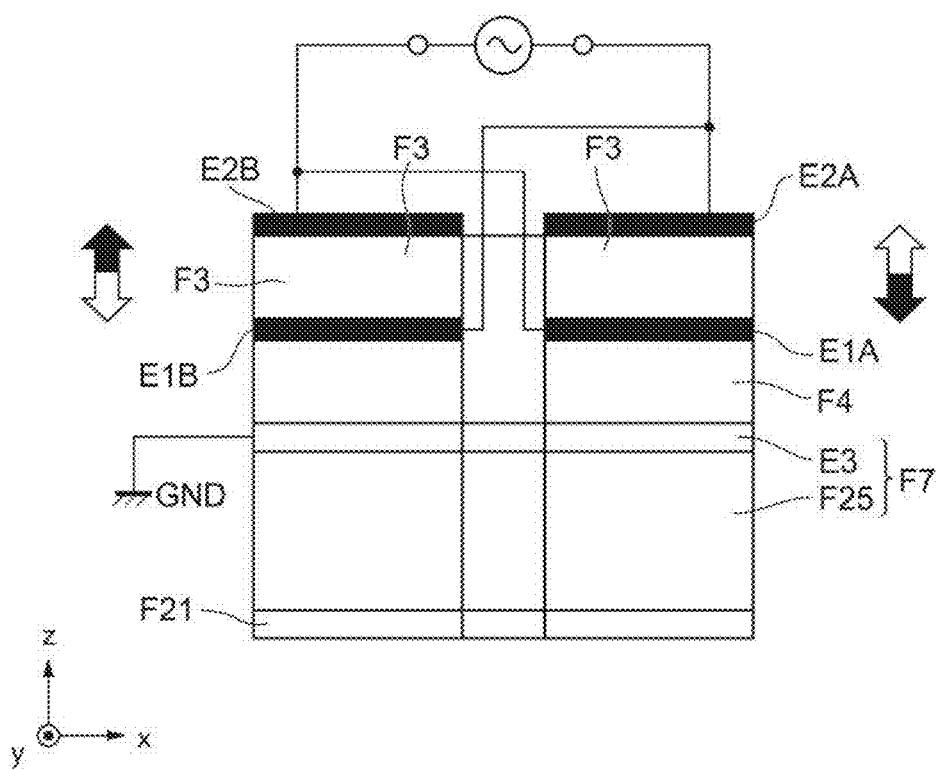
FIG. 13 schematically illustrates a section of a resonator according to an exemplary embodiment taken along line CC'.
Figure 14:
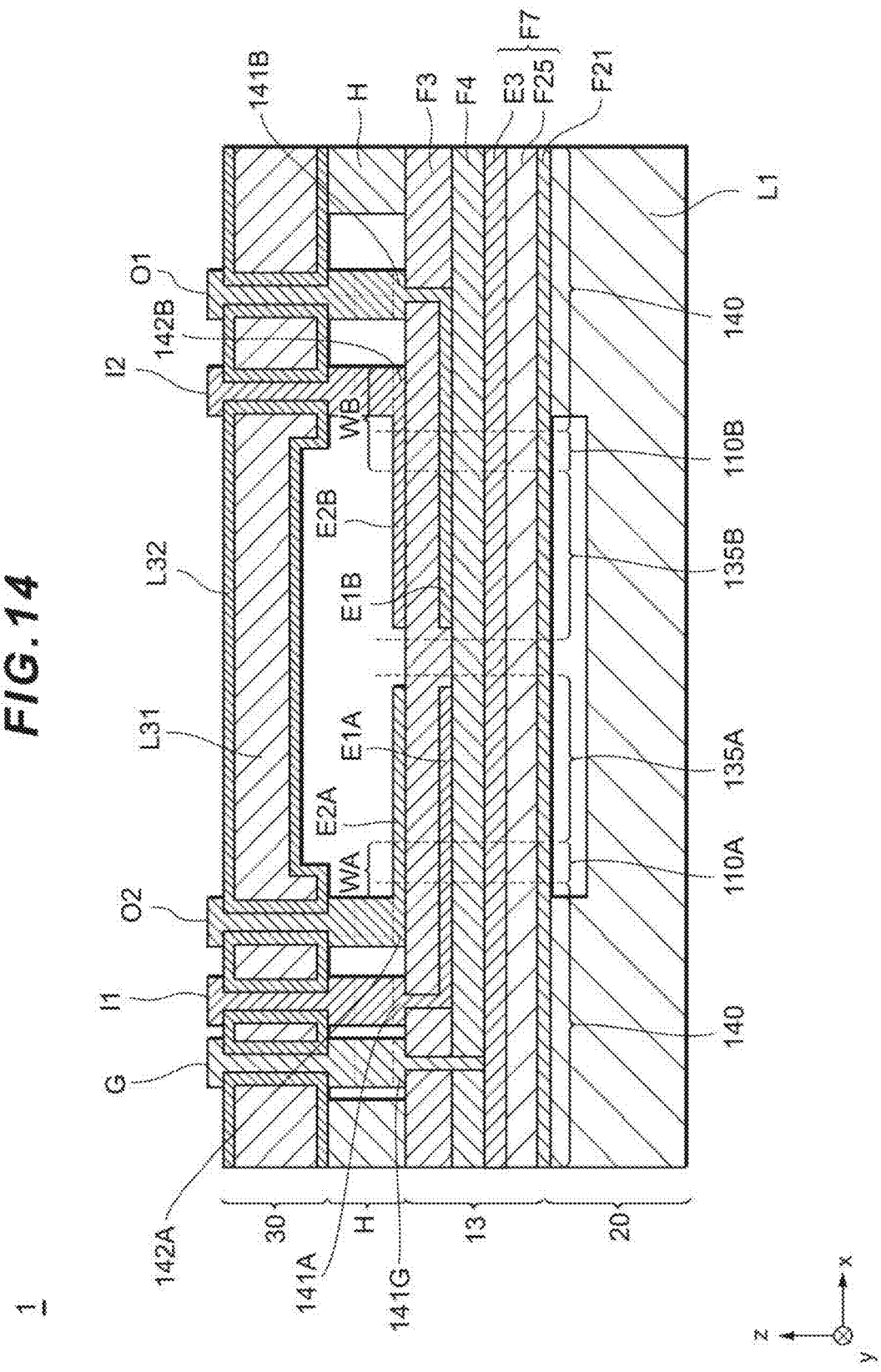
FIG. 14 schematically illustrates a section of a resonator according to an exemplary embodiment in FIG. 1 taken along line AA'.

Differences between a resonator 13 according to a fourth embodiment and that according to the first embodiment will be described with reference to FIG. 13 and FIG. 14. FIG. 13 schematically illustrates a section of the resonator 13 according to the present embodiment taken along line CC'. FIG. 14 schematically illustrates a section in FIG. 1 taken along line AA'.

The resonator 13 according to the present embodiment includes a substrate F7 instead of the Si substrate F2 according to the first embodiment. The substrate F7 includes a first layer F25 composed of an insulator or a semiconductor and a second layer E3 composed of a conductor. The second layer E3 is formed between the first layer F25 and the insulating film F4. The resistance of a route can be decreased by using, for the second layer E3, an electrode material having a resistance lower than that of Al or Mo of which the metal layers E2A, E2B, E1A, and E1B are composed, and the resonant resistance can be further decreased.

According to the present embodiment, the through-electrode G grounds the second layer E3. Other structures and functions are the same as those according to the first embodiment.

The exemplary embodiments are described above by way of example. The resonance device 1 according to the first embodiment of the present invention includes the substrate, the insulating film F4 that is formed on the substrate, and the vibration regions that are formed on the insulating film F4. Each vibration region includes the lower electrodes E1 that are formed on the insulating film F4, the piezoelectric film F3 that is formed on the lower electrodes E1, and the upper electrode E2 that is formed on the piezoelectric film F3. At least one lower electrode E1 of the lower electrodes E1 that are formed on the insulating film F4 has an electric potential that differs from that of another lower electrode E1 such that at least one vibration region vibrates in antiphase with another vibration region. The resonance device 1 includes the package 50 that seals the resonator 10 including the substrate, the insulating film F4, and the vibration regions and that includes the ground terminal G for grounding the substrate. In the resonance device 1 according to the present embodiment with this structure, the substrate is grounded in the resonator 10. This enables a stray capacitance that occurs in the insulating film F4 to be used as an additional capacitance. Consequently, the coupling coefficient can be prevented from decreasing by inhibiting the capacitance of the resonator 10 itself from increasing, and the oscillation margin can be increased.

The substrate is preferably the semiconductor substrate F2. The substrate may include the first layer F25 composed of an insulator or a semiconductor and the second layer E3 composed of a conductor that is formed between the first layer F25 and the insulating film F4. The ground terminal G may ground the second layer E3.

Moreover, the package may include the lower lid 20 that faces the substrate and the upper lid 30 that faces the upper electrode E2.

The resonator 10 may include the base 130 that includes two or more vibration arms 135 each of which has the stationary end and the open end and causes in-plane bending vibration, and that has the front edge 131A connected to the stationary end of each vibration arm 135 and the rear edge 131B facing the front edge 131A. The two or more vibration arms 135 may correspond to the vibration regions. The resonator 10 may be formed such that contour vibration of the piezoelectric film F3 occurs depending on a voltage that is applied to the piezoelectric film F3. Each of the vibration regions may have the long sides parallel to the node of the contour vibration of the piezoelectric film F3 and the short sides that are perpendicular to the node of the contour vibration of the piezoelectric film F3 and that correspond to the half wave length of the contour vibration.

The insulating film F4 is preferably composed of silicon nitride, AlN, or diamond. The use of a thermally conductive material having a low dielectric constant for the insulating film F4 inhibits the TED and inhibits the Q of the resonator 10 from decreasing when the bending vibration of the vibration member 120 occurs.

The insulating film F4 may include the layers of the layer F5 composed of a low dielectric constant material and the layer F6 composed of a high thermal conductivity material. In this case, the high thermal conductivity material is preferably aluminum nitride. The degree of freedom of selection of the material is increased by replacing the insulating film F4 with the insulating films F5 and F6 of two layers.

The resonator 10 according to the first embodiment includes the semiconductor substrate F2, the insulating film F4 that is formed on the semiconductor substrate F2, and the vibration regions that are formed on the insulating film F4. Each vibration region includes the lower electrodes E1 that are formed on the insulating film F4, the piezoelectric film F3 that is formed on the lower electrodes E1, and the upper electrode E2 that is formed on the piezoelectric film F3. At least one lower electrode E1 of the lower electrodes E1 that are formed on the insulating film F4 has an electric potential that differs from that of another lower electrode E1 such that at least one vibration region vibrates in antiphase with another vibration region. The semiconductor substrate F2 is connected to the ground terminal G for grounding. In the resonance device 1 according to the present embodiment with this structure, the semiconductor substrate F2 is grounded in the resonator 10. This enables a stray capacitance that occurs in the insulating film F4 to be used as an additional capacitance. Consequently, the coupling coefficient can be prevented from decreasing by inhibiting the capacitance of the resonator 10 itself from increasing, and the oscillation margin can be increased.

In general, it is noted that the embodiments are described above to make the present invention easy to understand and do not limit the present invention. It should be appreciated that the present invention can be modified and altered without departing from the spirit thereof. Exemplary embodiments obtained by appropriately modifying the embodiments by a person skilled in the art are included in the scope of the present invention provided that the embodiments have the features of the present invention. For example, the components according to the embodiments, the arrangement thereof, the material, conditions, shape, and size are not limited to those described above by way of example and can be appropriately changed. It goes without saying that the embodiments are described by way of example, and that the components according to the different embodiments can be partially replaced or combined. These having the features of the present invention are also included in the scope of the present invention.

REFERENCE SIGNS LIST 1 resonance device
10, 11, 12 resonator
20 lower lid
21 recessed portion
22 bottom plate
23 side wall
30 upper lid
31 recessed portion
33 side wall
50 package 110A, 110B hold arm
120, 121, 122 vibration member
130 base
131a long side
131A front edge
131b long side
131B rear edge
131c short side
131d short side
135A, 135B, 135C, 135D, 135E, 135F vibration arm
140 hold member
140a frame body
140b frame body
140c frame body
140d frame body
141A, 141B, 141G, 142A, 142B
235 protection film

What is claimed:

1. A resonance device comprising:
a substrate;
an insulating film disposed on the substrate;
a plurality of vibration regions each disposed on the insulating film and including lower electrodes disposed on the insulating film, a piezoelectric film disposed on the lower electrodes, and an upper electrode disposed on the piezoelectric film, with at least one lower electrode of the lower electrodes having an electric potential that differs from an electric potential of another lower electrode such that at least one vibration region is configured to vibrate in antiphase with another vibration region; and
a package configured to seal a resonator including the substrate, the insulating film, and the plurality of vibration regions, with the package including a ground terminal for grounding the substrate,
wherein the substrate includes a first layer composed of one of an insulator and a semiconductor and a second layer composed of a conductor that is disposed between the first layer and the insulating film, with the ground terminal grounding the second layer.

2. The resonance device according to claim 1, wherein the substrate is a semiconductor substrate.

3. The resonance device according to claim 1, wherein the package includes a lower lid that faces the substrate, and an upper lid that faces the upper electrode.

4. The resonance device according to claim 3, wherein the upper lid comprises a plurality of through-electrodes extending therethrough and coupled to the upper and lower electrodes of the plurality of vibration regions, respectively.

5. The resonance device according to claim 1, wherein the resonator includes:
a base with at least two vibration arms each having a stationary end coupled to the base and an open end configured for a bending vibration, and
wherein the at least two vibration arms correspond to the plurality of vibration regions, respectively.

6. The resonance device according to claim 5, wherein the at least two vibration arms each comprise a respective upper electrode that extends along substantially an entire surface of the respective vibration arm from the open end.

7. The resonance device according to claim 6, wherein each respective upper electrode extends on a surface of the base and comprises a width substantially the same as a width of the upper electrode on the respective vibration arm.

8. The resonance device according to claim 1, wherein the resonator is configured such that contour vibration of the piezoelectric film is dependent on a voltage applied to the piezoelectric film.

9. A resonance device comprising:
a substrate;
an insulating film disposed on the substrate;
a plurality of vibration regions each disposed on the insulating film and including lower electrodes disposed on the insulating film, a piezoelectric film disposed on the lower electrodes, and an upper electrode disposed on the piezoelectric film, with at least one lower electrode of the lower electrodes having an electric potential that differs from an electric potential of another lower electrode such that at least one vibration region is configured to vibrate in antiphase with another vibration region of the plurality of vibration regions; and
a package configured to seal a resonator including the substrate, the insulating film, and the plurality of vibration regions, with the package including a ground terminal for grounding the substrate,
wherein the resonator is configured such that contour vibration of the piezoelectric film is dependent on a voltage applied to the piezoelectric film, and
wherein each of the plurality of vibration regions has a long side parallel to a node of the contour vibration of the piezoelectric film and a short side perpendicular to the node of the contour vibration of the piezoelectric film and that corresponds to a half wave length of the contour vibration.

10. The resonance device according to claim 1, wherein the insulating film comprises a conductivity that is less than a conductivity of the substrate.

11. The resonance device according to claim 1, wherein the insulating film comprises at least one of silicon nitride, aluminum nitride, silicon dioxide, diamond, and sapphire.

12. The resonance device according to claim 1, wherein the insulating film is a multilayer structure comprising a layer having a low dielectric constant material and a layer having a high thermal conductivity material.

13. The resonance device according to claim 12, wherein the high thermal conductivity material is aluminum nitride, silicon nitride, diamond, or sapphire.

14. A resonator comprising:
a substrate;
an insulating film disposed on the substrate; and
a plurality of vibration regions each disposed on the insulating film and including lower electrodes disposed on the insulating film, a piezoelectric film disposed on the lower electrodes, and an upper electrode disposed on the piezoelectric film,
wherein at least one lower electrode of the lower electrodes on the insulating film has an electric potential that differs from an electric potential of another lower electrode on the insulating film, such that the respective vibration regions are configured to vibrate in antiphase with each other,
wherein the substrate includes a first layer comprising one of an insulator and a semiconductor and a second layer comprising a conductor that is disposed between the first layer and the insulating film, and
wherein the second layer of the substrate is connected to a ground terminal for grounding.

15. The resonator according to claim 14, wherein the substrate comprises a semiconductor.

16. The resonator according to claim 14, further comprising:
- a base with a plurality of vibration arms each having a stationary end coupled to the base and an open end configured for a bending vibration, and
- wherein the plurality of vibration arms correspond to the plurality of vibration regions, respectively.

17. The resonator according to claim 16, wherein the plurality of vibration arms each comprise a respective upper electrode that extends along substantially an entire surface of the respective vibration arm from the open end.

18. The resonator according to claim 17, wherein each respective upper electrode extends on a surface of the base and comprises a width substantially the same as a width of the upper electrode on the respective vibration arm.

\* \* \* \* \*